(12) United States Patent
Chen et al.

(10) Patent No.: US 11,199,825 B2
(45) Date of Patent: Dec. 14, 2021

(54) STANDARD TRACK SMART HOME SYSTEM

(71) Applicant: THINKHOME IOT TECHNOLOGY CO., LTD., Ningbo (CN)

(72) Inventors: Shengpiao Chen, Ningbo (CN); Lei Zhang, Ningbo (CN); Xufeng Zhang, Ningbo (CN); Junquan Lu, Ningbo (CN)

( * ) Notice: Subject to any disclaimer, the term of this patent is extended or adjusted under 35 U.S.C. 154(b) by 46 days.

(21) Appl. No.: 16/768,775

(22) PCT Filed: Nov. 30, 2018

(86) PCT No.: PCT/CN2018/118364
§ 371 (c)(1),
(2) Date: Jun. 1, 2020

(87) PCT Pub. No.: WO2019/114561
PCT Pub. Date: Jun. 20, 2019

(65) Prior Publication Data
US 2020/0371486 A1    Nov. 26, 2020

(30) Foreign Application Priority Data
Dec. 14, 2017  (CN) .......................... 201711342895.7

(51) Int. Cl.
*G05B 19/042*  (2006.01)
*H04L 12/28*   (2006.01)
*H04L 12/70*   (2013.01)

(52) U.S. Cl.
CPC ........ *G05B 19/042* (2013.01); *H04L 12/2803* (2013.01); *H04L 12/2834* (2013.01); *G05B 2219/2642* (2013.01); *H04L 2012/5618* (2013.01)

(58) Field of Classification Search
CPC .......... G05B 19/042; G05B 2219/2642; H04L 12/2803; H04L 12/2834; H04L 2012/5618; H05K 7/1474
See application file for complete search history.

(56) References Cited

U.S. PATENT DOCUMENTS

| | | | |
|---|---|---|---|
| 2011/0113488 A1* | 5/2011 | Schultz ............... | G06F 21/6245 726/21 |
| 2011/0292552 A1* | 12/2011 | Chen .................... | H05K 9/0066 361/56 |
| 2014/0085059 A1* | 3/2014 | Chen ..................... | G08C 17/02 340/12.3 |
| 2018/0316518 A1* | 11/2018 | Farrahi Moghaddam .................. | H04L 47/70 |
| 2021/0014001 A1* | 1/2021 | Yilmaz .................. | H04L 45/74 |

* cited by examiner

*Primary Examiner* — Christine Ng
(74) *Attorney, Agent, or Firm* — Clement Cheng

(57) ABSTRACT

A standard track smart home system, comprising: a gateway device (1), a power interface of the gateway device (1) being respectively connected to a power supply live line (L) and a power supply zero line (N), the gateway device (1) remotely connecting to at least one user terminal, and the gateway device (1) being also used for connecting to a plurality of first expansion devices (10); and a standard track (T), the gateway device (1) and the plurality of first expansion devices (10) being arranged side by side on the standard track (T) and connected to one another by means of a plurality of wiring terminals, and outgoing interfaces of each of the first expansion devices (10) being respectively connected to one or more smart home devices.

9 Claims, 2 Drawing Sheets

(12) United States Patent

STANDARD TRACK SMART HOME SYSTEM

BACKGROUND OF THE INVENTION

1. Field of the Invention

The invention relates to the technical field of smart home system, and more particularly, to a standard track smart home system.

2. Description of the Related Art

A smart home refers to a convenient home setup where subsystems associated with people's daily life, such as, security, lighting control, curtain control, gas valve control, information appliances, scene linkage, floor heating, health care, health and epidemic prevention, security and security guard, are closely connected by using advanced computer technology, network communication technology, comprehensive wiring technology, and medical electronic technology, with emphasis on ergonomics, so as to realize intelligent control and management of smart home appliances. In addition, the arrangement is tailored to the users' needs, thereby creating a band-new life style of "putting people first".

The smart home system has a notable characteristic, that is, the more modules used in the entire system, the more scarred the arrangements, the higher the complexity, and the higher the cost; the possibility of failure is greater, and the corresponding maintenance costs are also high. Specifically, the system is remotely debugged and maintained through the network, which not only allows users to control the smart home system, but also allows technicians to remotely check the working status of the system and diagnose faults of the system. In general, a lot of works are required for installation, debugging and maintenance of the system, and it has become a hotspot of the smart home system as how to expand and integrate the system according to users' needs.

SUMMARY OF THE INVENTION

Given that the foregoing problems exist in the prior art, the present invention provides a standard track smart home system.

The technical solution is as follows:

a standard track smart home system, comprising:

a gateway device, a power interface of the gateway device being respectively connected to a power supply live line L and a power supply zero line N, the gateway device remotely connecting to at least one user terminal, and the gateway device being also used for connecting to a plurality of first expansion devices; and a standard track T, the gateway device and the plurality of first expansion devices being arranged side by side on the standard track T and connected to one another by means of a plurality of wiring terminals; and outgoing interfaces of each of the first expansion devices being respectively connected to one or more smart home devices.

Preferably, the standard track smart home system comprises a leakage protector, the leakage protector is arranged on the standard track T, the leakage protector is provided with a power interface, and an outgoing interface and a switch;

the power interface is respectively connected to the power supply live line L and the power supply zero line N, the outgoing interface is respectively connected to the power supply live line L and the power supply zero line N and is connected to the power interface of the gateway device, the switch is configured to realize leakage protection and to control the on/off of the power supply live line L and the power supply zero line N.

Preferably, the standard track smart home system comprises a power supply device, the power supply device is arranged on the standard track T, the power supply device is used for connecting to a plurality of second expansion devices, and the power supply device is used for supplying power to all of the plurality of second expansion devices.

Preferably, the standard track smart home system comprises a connector, the connector is arranged on the standard track T for connecting to the plurality of first expansion devices in rows.

Preferably, the gateway device comprises a network port and a wireless networking module;

wherein the gateway device is connected to the user terminal via wired connection through the network port, or the gateway device is connected to the user terminal via wireless connection through the wireless networking module.

Preferably, the plurality of first expansion devices are a single-phase intelligent air switch or a three-phase intelligent air switch.

Preferably, the plurality of second expansion devices are an environmental sensor, or a cloud controller, or a wireless receiver, or a remote controller.

Preferably, the gateway device comprises a first indicator light, the first indicator light is configured to indicate the working status of the gateway device.

Preferably, the plurality of first expansion devices comprise a second indicator light, the second indicator light is used to indicate the connection status between the plurality of first expansion devices and the gateway device.

By adopting the above-mentioned technical solutions, the present invention has the beneficial effects that a standard track smart home system is disclosed, according to a power supply circuit, users can choose to add expansion devices as required thereby, and systematically integrate the distributed smart home control modules on a standard track to facilitate user operation and management, so as to realize intelligent control of smart home appliances.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

The technical solution set forth in the embodiments of the present invention will now be described clearly and fully hereinafter with reference to the accompanying drawings of the embodiments of the present invention. Obviously, such embodiments provided in the present invention are only part of the embodiments instead of all embodiments. It should be understood that all the other embodiments obtained from the embodiments set forth in the present invention by one skilled in the art without any creative work fall within the scope of the present invention.

Notably, the embodiments set forth in the present invention and features of the embodiments may be combined in any suitable manner.

The present invention will be described hereinafter with reference to the accompanying drawings and particular embodiments, but the invention is not limited thereto.

The invention comprises a standard track smart home system, comprising:

a gateway device 1, a power interface of the gateway device 1 being respectively connected to a power supply live line L and a power supply zero line N, the gateway device 1 remotely connecting to at least one user terminal, and the gateway device 1 being also used for connecting to a plurality of first expansion devices 10; and a standard track T, the gateway device 1 and the plurality of first expansion devices 10 being arranged side by side on the standard track T and connected to one another by means of a plurality of wiring terminals (not shown in figures); and outgoing interfaces of each of the plurality of first expansion devices 10 being respectively connected to one or more smart home devices.

Figure 1:
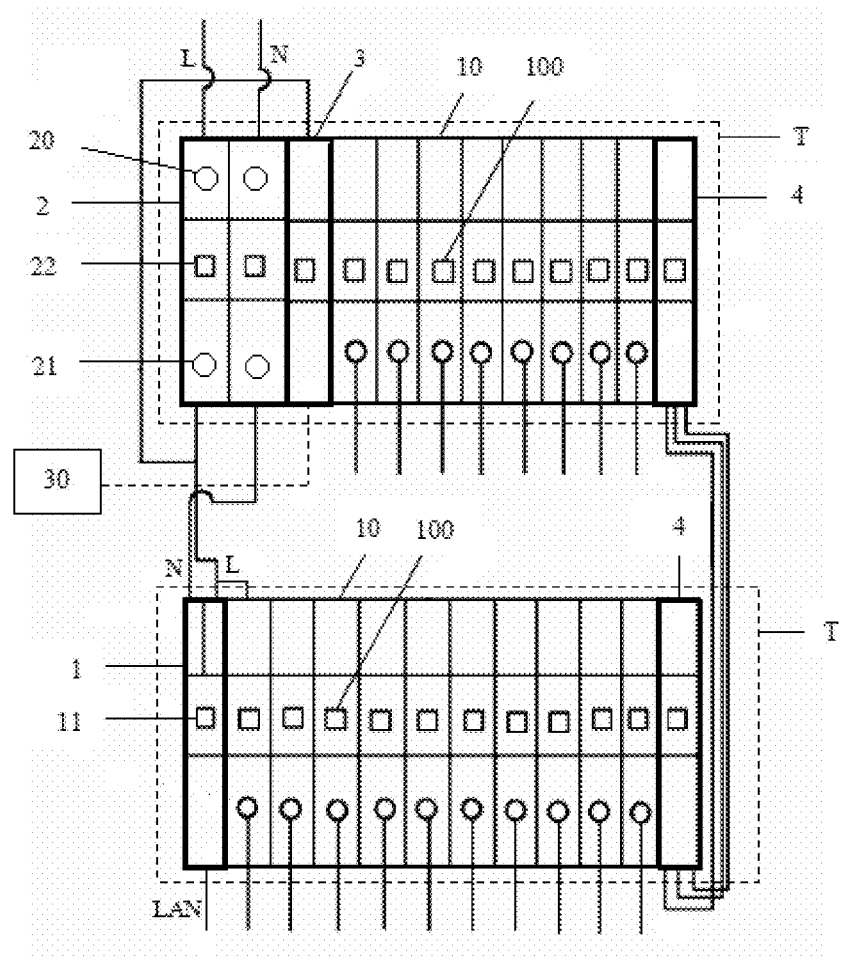
FIG. 1 is an overall structure diagram of a single-phase standard track smart home system according to an embodiment of the present invention.

By adopting the above-mentioned technical solution of the standard track smart home system, as shown in FIG. 1, the gateway device 1 and the plurality of first expansion devices 10 are arranged side by side on the standard track T and connected to one another by means of a plurality of wiring terminals (not shown in figures). Specifically, the wiring terminals (not shown in figures) are 8-pin terminals, and are used for electrically connecting the gateway device 1 and the plurality of first expansion devices 10, so that the plurality of first expansion devices 10 are powered on. The gateway device 1 is used for connecting to the plurality of first expansion devices 10, and each of the plurality of first expansion devices 10 individually controls the smart home appliance connected thereto through the user terminal or local operations. The smart home appliances comprise lighting devices, floor heating, air conditioners, air cleaning equipments, and curtains.

Furthermore, according to a power supply circuit, users can choose to add first expansion devices 10 as required thereby, and systematically integrate the distributed smart home control modules on a standard track T to facilitate user operation and management, so as to realize intelligent control of smart home appliances.

It should be noted that the expansion devices used in the present invention are not limited to the arrangement in which the first expansion devices 10 is a single-phase intelligent air switch or a three-phase intelligent air switch. The first expansion devices 10 can also be replaced according to users' needs. It is possible to systematically integrate the first expansion devices 10 on a standard track T through the standard track smart home system. Details will not be repeated herein.

In a preferred embodiment, the standard track smart home system comprises a leakage protector 2, the leakage protector 2 is arranged on the standard track T, the leakage protector 2 is provided with a power interface 20, and an outgoing interface 21 and a switch 22;

the power interface 20 is respectively connected to the power supply live line L and the power supply zero line N, the outgoing interface 21 is respectively connected to the power supply live line L and the power supply zero line N and is connected to the power interface of the gateway device 1, the switch 22 is configured to realize leakage protection and to control the on/off of the power supply live line L and the power supply zero line N.

Specially, the leakage protector 2 is arranged on the standard track T. The leakage protector 2 is an air switch with a leakage protection function for a single-phase and a three-phase standard track smart home system.

In a preferred embodiment, as shown in FIG. 1, the standard track smart home system comprises a power supply device 3, the power supply device 3 is arranged on the standard track T, the power supply device 3 is used for connecting to a plurality of second expansion devices 30, and the power supply device 3 is used for supplying power to all of the plurality of second expansion devices 30. The power supply device 3 is used for connecting to external various types of expansion devices, comprising a plurality of second expansion devices 30, and the plurality of second expansion devices 30 is an environmental sensor, or a wireless receiver, or a remote controller.

In a preferred embodiment, as shown in FIG. 1, the standard track smart home system comprises a connector 4, the connector 4 is arranged on the standard track T for connecting to the plurality of first expansion devices 10 in rows. According to user's requirements, the connector 4 is connected to the standard track T. The connector 4 is connected so that the first expansion devices 10 in rows may be communicatively connected to one another.

In a preferred embodiment, the gateway device 1 comprises a network port LAN and a wireless networking module (not shown in the figures);

wherein the gateway device 1 is connected to the user terminal via wired connection through the network port LAN, or the gateway device 1 is connected to the user terminal via wireless connection through the wireless networking module (not shown in the figures). The wireless networking module (not shown in the figures) uses the wireless networking capabilities inside the gateway device 1, comprising the WIFI networking capability.

It should be noted that the user terminals as used herein are not limited to mobile user terminals or non-mobile user terminals. It is only necessary to successfully add the cloud controller. Details will not be repeated herein.

In a preferred embodiment, each of the first expansion devices 10 is a single-phase intelligent air switch or a three-phase intelligent air switch. The first expansion devices 10 herein are not limited to the single-phase intelligent air switch or the three-phase intelligent air switch. First of all, users start to choose the first expansion device 10 according to the power supply circuit and the actual needs. The gateway device 1 and the leakage protector 2 are commonly arranged on the standard track T. Through the user terminal of the gateway device 1 controlling, or the smart home appliances locally controlling the corresponding first expansion device 10 connected thereto, so that the standard track smart home system systematically integrates the distributed smart home appliances on a standard track to facilitate user operation and management.

In a preferred embodiment, the plurality of second expansion devices 30 are an environmental sensor, a cloud controller, a wireless receiver, or a remote controller.

It should be noted that the plurality of second expansion devices 30 are not limited to an environmental sensor, a cloud controller, a wireless receiver, or a remote controller. The second expansion devices 30 can also be replaced according to users' needs. It is possible to systematically integrate the second expansion devices 30 on a standard track T through the standard track smart home system. Details will not be repeated herein.

In a preferred embodiment, the gateway device 1 comprises a first indicator light 11, the first indicator light 11 is configured to indicate the working status of the gateway device 1.

Specifically, the first indicator light 11 is configured to indicate the working status of the gateway device 1;

when the first indicator light 11 flashes green, it indicates that the gateway device 1 is successfully powered on;

when the first indicator light 11 flashes green then turns off, it indicates that the gateway device 1 fails to be powered on;

when the first indicator light 11 flashes green slowly, it indicates that the gateway device 1 is successfully connected to network in a wired mode;

when the first indicator light 11 flashes green rapidly, it indicates that the gateway device 1 fails to be connected to network in a wired mode, or it is in the process of connecting;

when the first indicator light 11 is solid red and it flashes green intermittently, it indicates that the gateway device 1 is in a wireless configuration status;

when the first indicator light 11 is solid red and it flashes green slowly, it indicates that the gateway device 1 is successfully connected to the network in a wireless mode; and when the first indicator light 11 is solid red and it flashes green rapidly, it indicates that the gateway device 1 fails to be connected to network in a wireless mode, or it is in the process of connecting.

In a preferred embodiment, the plurality of first expansion devices 10 comprise a second indicator light 100, the second indicator light 100 is configured to indicate the connection status between the first expansion devices 10 and the gateway device 1.

Specifically, the second indicator light 100 is configured to indicate the connection status between the first expansion devices 10 and the gateway device 1;

after the gateway device 1 is powered on, the second indicator light 100 flashes red, indicating that the first expansion device 10 is successfully powered on;

after the gateway device 1 is powered on, the second indicator light 100 flashes red then turns off, indicating that the first expansion device 10 fails to be powered on;

when the second indicator light 100 flashes red rapidly and turns off, it indicates that the first expansion device 10 is successfully connected to the gateway device 1;

when the second indicator light 100 flashes red rapidly, it indicates that the first expansion device 10 fails to be connected to the gateway device 1 or it is in the process of connecting to the gateway device 1;

when the second indicator light 100 is solid green, it indicates that the first expansion device 10 is turned on;

when the second indicator light 100 is green and turns off, it indicates that the first expansion device 10 is turned off;

when the first expansion device 10 is in a locked state or in an unlocked state, the second indicator light 100 displays opposite colors. It can be switched to the locked state when the button on the top of the first expansion device 10 is long pressed. After entering the locked state, the standard track smart home system can only be operated locally.

In a preferred embodiment, as shown in FIG. 1, in a single-phase standard track smart home system, a leakage protector 2, a power supply unit 3, and a plurality of first expansion devices 10 are arranged side by side on the standard track T, and the plurality of first expansion devices 10 are connected to one another by means of a plurality of wiring terminals (not shown in figures). The wiring terminals are 8-pin terminals (not shown in figures), and are used for electrically connecting the plurality of first expansion devices 10. The power supply device 3 is used for connecting to external various types of expansion devices, including the second expansion device 30.

Furthermore, a plurality of first expansion devices 10 and a gateway device 1 are arranged side by side on another standard track T and are connected to one another by means of a plurality of wiring terminals (not shown in figures). Specifically, the wiring terminals (not shown in figures) are 8-pin terminals, and are used for electrically connecting the gateway device 1 and the plurality of first expansion devices 10. The first expansion devices 10 in two rows are connected to one another via a connector 4, so that the plurality of first expansion devices 10 in two rows may be communicatively connected to one another, so that the standard track smart home system systematically integrate the distributed smart home control modules on a standard track T to facilitate user operation and management.

Figure 2:
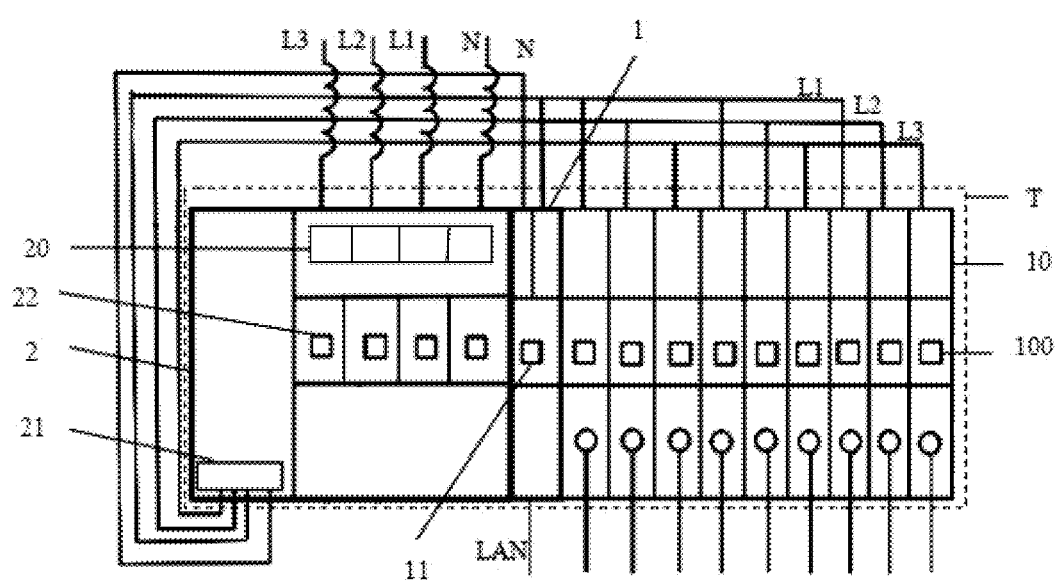
FIG. 2 is an overall structure diagram of a three-phase standard track smart home system according to an embodiment of the present invention

In a preferred embodiment, as shown in FIG. 2, in a three-phase standard track smart home system, a gateway device 1, a leakage protector 2, and a plurality groups of first expansion devices are arranged side by side on the standard track T. Each group of the first expansion devices comprises three first expansion devices 10. A power interface of each of the first expansion devices 10 is respectively connected to a power supply live line L, so that the first expansion devices 10 is powered on; outgoing interfaces of each of the first expansion devices 10 are respectively connected to one or more smart home devices. Each of the first expansion devices 10 individually controls a smart home device correspondingly connected thereto through the user terminal or local terminal. Every three single-phase first expansion devices 10 may form a group of three-phase first expansion devices, and the users can connect to the three-phase first expansion device as required through the connector 4.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A standard track smart home system, comprising:
   a gateway device, a power interface of the gateway device being respectively connected to a power supply live line (L) and a power supply zero line (N), the gateway device remotely connecting to at least one user terminal, and the gateway device being also used for connecting to a plurality of first expansion devices; and
   a standard track (T), the gateway device and the plurality of first expansion devices being arranged side by side on the standard track (T) and connected to one another by means of a plurality of wiring terminals; and
   outgoing interfaces of each of the plurality of first expansion devices being respectively connected to one or more smart home devices.

2. The standard track smart home system of claim 1, comprising a leakage protector, the leakage protector being arranged on the standard track (T), the leakage protector being provided with a power interface, and an outgoing interface and a switch;
   wherein, the power interface is respectively connected to the power supply live line (L) and the power supply zero line (N), the outgoing interface is respectively connected to the power supply live line (L) and the power supply zero line (N) and is connected to the power interface of the gateway device, the switch is configured to realize leakage protection and to control the on/off of the power supply live line (L) and the power supply zero line (N).

3. The standard track smart home system of claim 1, comprising a power supply device, wherein, the power supply device is arranged on the standard track (T), the power supply device is used for connecting to a plurality of second expansion devices, and the power supply device is used for supplying power to all of the plurality of second expansion devices.

4. The standard track smart home system of claim 3, wherein the plurality of second expansion devices are an environmental sensor, or cloud controller, or a wireless receiver, or a remote controller.

5. The standard track smart home system of claim 1, comprising a connector, wherein, the connector is arranged on the standard track (T) for connecting to the plurality of first expansion devices in rows.

6. The standard track smart home system of claim 1, wherein the gateway device comprises a network port and a wireless networking module;
    wherein the gateway device is connected to the at least one user terminal via wired connection through the network port, or
    the gateway device is connected to the at least one user terminal via wireless connection through the wireless networking module.

7. The standard track smart home system of claim 1, wherein the plurality of first expansion devices are a single-phase intelligent air switch or a three-phase intelligent air switch.

8. The standard track smart home system of claim 1, wherein the gateway device comprises a first indicator light, the first indicator light is used to indicate the working status of the gateway device.

9. The standard track smart home system of claim 1, wherein the plurality of first expansion devices comprise a second indicator light, the second indicator light is used to indicate the connection status between the plurality of first expansion devices and the gateway device.

* * * * *